United States Patent [19]

Yamazaki et al.

[11] Patent Number: 4,641,168

[45] Date of Patent: Feb. 3, 1987

[54] LIGHT SENSITIVE SEMICONDUCTOR DEVICE FOR HOLDING ELECTRICAL CHARGE THEREIN

[75] Inventors: Mutsuki Yamazaki; Eiichi Kaga, both of Yokohama, Japan

[73] Assignee: Tokyo Shibaura Denki Kabushiki Kaisha, Kawasaki, Japan

[21] Appl. No.: 547,921

[22] Filed: Nov. 2, 1983

[30] Foreign Application Priority Data

| | | | |
|---|---|---|---|
| Jan. 26, 1983 | [JP] | Japan | 58-11933 |
| Apr. 6, 1983 | [JP] | Japan | 58-61324 |
| Apr. 6, 1983 | [JP] | Japan | 58-61325 |
| Apr. 6, 1983 | [JP] | Japan | 58-61326 |
| Jul. 19, 1983 | [JP] | Japan | 58-130218 |

[51] Int. Cl.⁴ .......................... H01L 27/14; H01L 31/00

[52] U.S. Cl. .......................... 357/30

[58] Field of Search .......................... 357/30; 430/57, 60

[56] References Cited

U.S. PATENT DOCUMENTS 4,460,669 7/1984 Ogawa et al. .......................... 430/57

*Primary Examiner*—William L. Sikes

*Assistant Examiner*—Robert E. Wise

*Attorney, Agent, or Firm*—Cushman, Darby & Cushman

[57] ABSTRACT

In a semiconductor device intended to hold an electric charge due to being exposed to light, a photoconductive layer having a surface capable of being electrically charged is provided. A conductive base member is intended to support the photoconductive layer and permits the flow of electric charge therethrough. Between the photoconductive layer and the conductive base member, a first barrier layer and a second barrier layer are provided, the first barrier layer having a predetermined resistivity and being formed of a semiconductor serving to control the flow of an electric charge between the photoconductive layer and the conductive base member, and said second barrier layer having a resistivity which is higher than that of the first barrier layer and also being formed of a semiconductor serving to control the flow of an electric charge between the photoconductive layer and conductive base member. By the actions of the first and second barrier layers, it is possible to obtain a satisfactory percentage of charge holding.

17 Claims, 8 Drawing Figures

FIG. 1
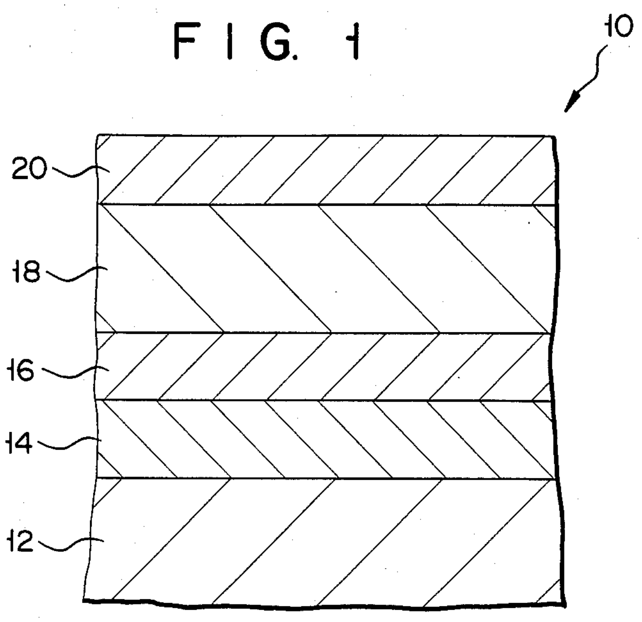
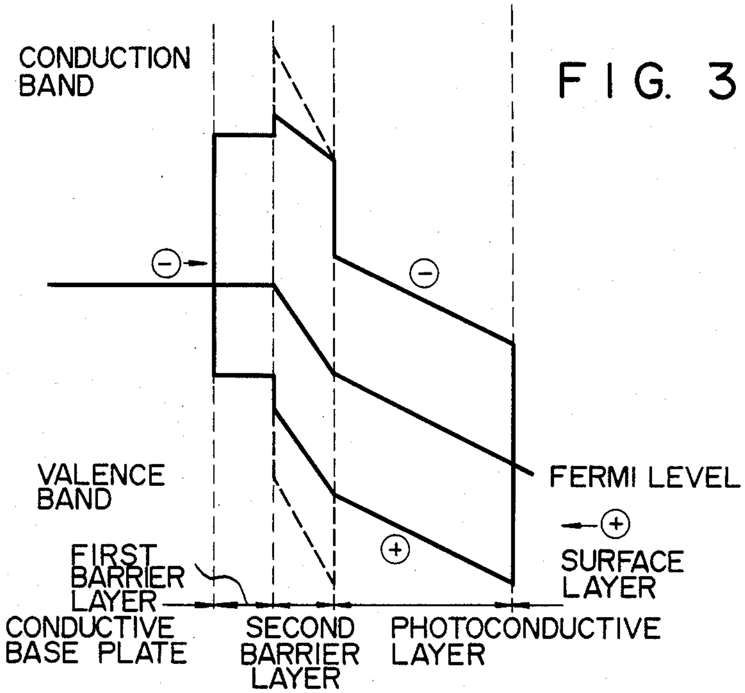
FIG. 3

LIGHT SENSITIVE SEMICONDUCTOR DEVICE FOR HOLDING ELECTRICAL CHARGE THEREIN

BACKGROUND OF THE INVENTION

The present invention relates to a semiconductor device which is used in a solid-state image sensing device or an electro-photographic photosensitive body and is intended to sense light.

In this specification, the term "light" is defined to mean the electro-magnetic waves falling between an ultraviolet-ray region and a gamma-ray region.

In an electronic copying machine, for example, the semiconductor device used in an electro-photographic photosensitive body must satisfy the following two requirements: first, it must have photoconduction; and, secondly it must hold, for a prescribed period of time, the electrical charge produced, due to a corona discharge, on its photosensitive body surface. Thus, the electro-photographic photosensitive body should have the electrical properties of being high in dark resistance or resistivity (approximately $10^{14}$ Ωcm) and of becoming low in resistivity when irradiated with light.

The principle of the electronic copying machine will now be explained briefly, in clarifying the above-mentioned requirements to be satisfied by the semiconductor device. Corona discharge is so effected that an electrical charge may flow onto the photosensitive body surface, thereby electrically charging the same. The photosensitive body surface holds that electrical charge therein for a predetermined period of time. Accordingly, the photosensitive body must have high dark resistance. Thereafter, light is irradiated onto the photosensitive body. Consequently, paired carriers of electrons and holes are produced on the photoconductive layer. Either one of these electron-hole pairs will neutralize the electrical charge held on the photoconductive surface, while the other thereof flows toward a conductive base member. Accordingly, the photosensitive body must have low resistivity when light is irradiated thereonto. For example, if the surface of the photosensitive body is positively charged, the electron produced upon the irradiation of light neutralizes the resultant electrical charge resulting the positive charge, and the hole produced will flow toward the conductive base member. Specifically, the latent image of an electrostatic charge is formed on the surface of the photosensitive body, due to the irradiation of light. Thereafter; the toner, which is so charged that its electrical charge may have a negative or positive value different from that of the electrical charge forming the latent image on the photosensitive body surface, is adhered thereto in accordance with Coulomb's law. Finally, this toner is transferred onto a sheet of paper, thereby completing the photographic copy.

In order to satisfy the two requirements referred to above, the semiconductor device used in the prior art electro-photographic photosensitive body is comprised of a base member having conductivity; an insulator or a semiconductor layer of one type formed on the conductive base member and having high resistivity; a photoconductive layer formed on the semiconductor layer or on the insulator; and a photosensitive layer formed on the photoconductive layer and having a photosensitive surface. In this prior art semiconductor device, the flow of an electrical charge from the conductive base member into the photosensitive layer is prevented by the action of the insulator or of the semiconductor layer of one type, and this electrical charge is held in the photosensitive surface for a predetermined period of time. When the single semiconductor layer is employed, the flow of a selected electrical charge (e.g., a positive charge) from the base member into the photosensitive layer cannot be fully prevented. When the insulator is employed, the flow of the selected electrical charge from the base member into the photosensitive layer can be reliably prevented. However, at the same time, the flow of the electrical charge of the opposite type (e.g., a negative charge) from the photosensitive layer to the base member is also prevented. In this case, the residual voltage will increase, resulting in fog. In this prior art semiconductor device, for example three layers are formed or stacked on the conductive base member, i.e., an amorphous silicon layer doped with boron (B) and carbon (C) and serving as a semiconductor layer, an amorphous silicon layer doped with a little of boron (B) and serving as a photoconductive layer, and an amorphous silicon layer doped with carbon (C) and serving as a surface layer, in the order mentioned. This prior art electro-photographic photosensitive device is capable of being charged with an electrical charge of approximately 300 V.

The above-mentioned prior art semiconductor device does not have the capacity to hold an electrical charge on its photosensitive layer for a specified period of time, after this electrical charge is charged therein, i.e., it does not have a satisfactory percentage of potential maintenance. For example, the percentage of potential maintenance was approximately 40% when 15 seconds had elapsed, after the device was charged.

SUMMARY OF THE INVENTION

Accordingly, the object of the present invention is to provide a semiconductor device which can sustain a satisfactory percentage of potential maintenance by effectively preventing the flow of a selected type of electrical charge from its conductive base member into its photosensitive layer and which can prevent the increase in residual voltage by allowing the flow of the opposite type of electrical charge from its photosensitive layer into its conductive base member.

According to an aspect of the present invention, a semiconductor device is provided, in which a semiconductor device for holding an electric charge which has been charged therein, comprising a photoconductive layer having a surface which is capable of being charged and generating carrier which carry the electric charge when it is irradiated with light, a conductive base member supporting the photoconductive layer, a first barrier layer provided between the photoconductive layer and the conductive base member, having a predetermined resistivity, which hinders the movement of the electric charge from the conductive base member to the photoconductive layer and permits the movement of an electric charge from the photoconductive layer to the conductive base member, the electric charge having a minus or plus charge polarity the same as that of the electric charge to be charged on the surface of the photoconductive layer, and a second barrier layer provided between said photoconductive layer and the conductive base member, having a predetermined resistivity different from that of the first barrier layer, which hinders the movement of the electric charge from the conductive base member to the photoconductive layer and permits the movement of an electric charge from the photoconductive layer to the conductive base member, the electric charge having a minus or plus sign the same as that of the electric charge to be charged on the surface of the photoconductive layer.

BRIEF DESCRIPTION OF THE DRAWINGS

FIG. 1 is a sectional view of a semiconductor device according to a first embodiment of the present invention;

FIG. 3 is a view showing the energy level, in explaining the effect of the first embodiment of the present invention;

DETAILED DESCRIPTION OF THE PREFERRED EMBODIMENTS

Figure 2:
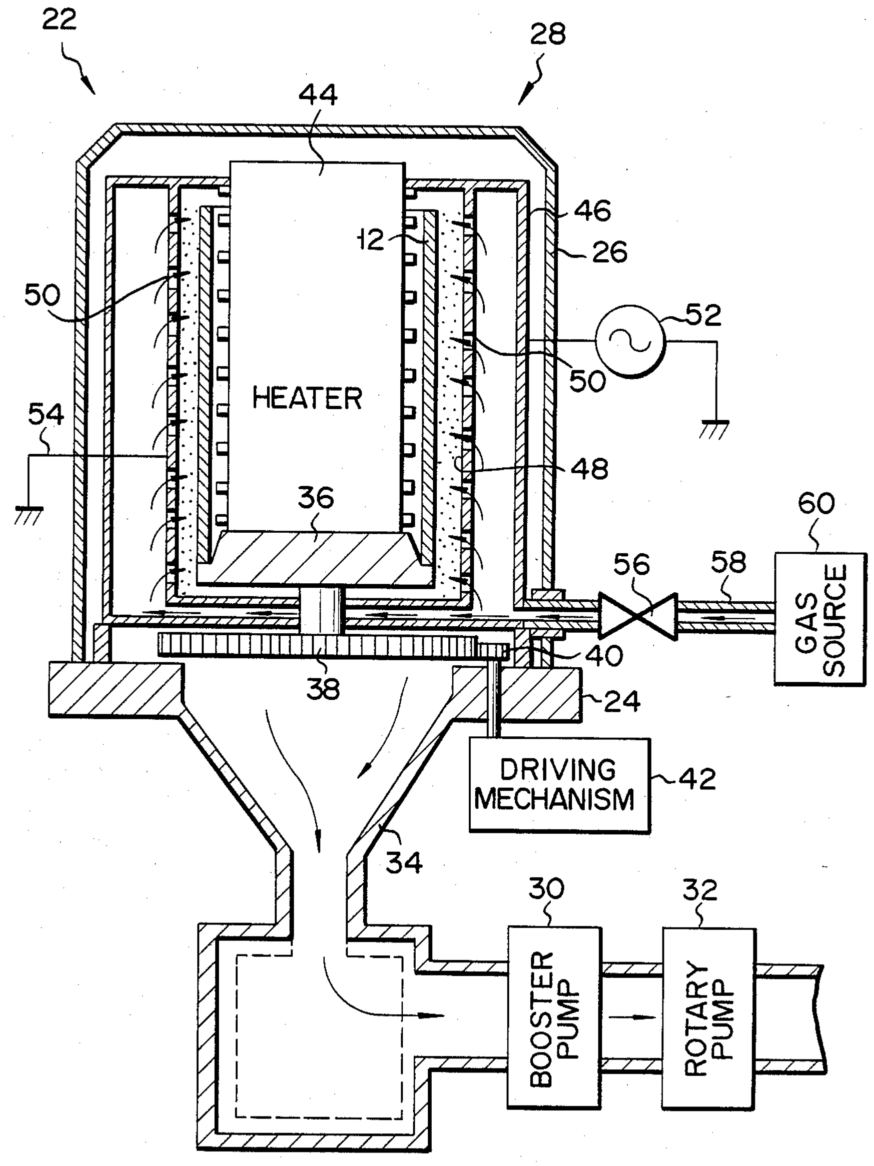
FIG. 2 is a schematic sectional view of an apparatus for manufacturing the semiconductor device shown in FIG. 1.

Preferred embodiments of the present invention may now be described in greater detail, with reference to FIGS. 1 to 8 of the accompanying drawings. A first embodiment will first be described via FIGS. 1 and 2. Formed on the photosensitive body (semiconductor device) 10 used in an electronic copying machine, is a conductive base member or plate 12 and four further layers; a first barrier layer 14 and a second barrier layer 16, both being formed of semiconductor material and intended to control the flow of electric charge from the conductive base plate 12; a photoconductive layer 18; and a surface layer 20.

The conductive base plate 12 is made of a conductive material, e.g., an aluminium material, and is shaped like a drum or flat plate.

The first barrier layer 14 is intended to prevent the entry of electric charge from the conductive base plate 12 into the photoconductive layer 18 and, at the same time, to permit the movement of electric charge which has different sign, thus preventing the entry of electric charge, from the photoconductive layer 18 into the conductive base plate 12. The layer 14 is made of p-type or n-type semiconductor material, which is made from amorphous silicon doped with, for example, an element of Group IIIA of the periodic table such as boron (B) and/or an element of Group VA of the periodic table such as, phosphorus (P). Where the amorphous silicon is doped with boron (B), the content of boron (boron/boron+silicon: B/B+Si) is preferably 1.0 to $1\times10^{-3}$ atomic %, and, in this embodiment, is $5\times10^{-2}$ atomic %.

The thickness of the first barrier layer 14 is approximately 0.5 μm or more, or more preferably within a range of 0.5 μm to 2.5 μm, and, in this embodiment, approximately 2.5 μm.

The specific resistivity of the first barrier layer 14 is approximately $10^9$ Ωcm or less, and, in this embodiment, approximately $10^7$ Ωcm.

The second barrier layer 16 is intended to supplement the function of the first barrier layer 14 and is made of p-type or an n-type semiconductor, which has a resistivity higher than that of the first barrier layer 14, (i.e., $10^9$ Ωcm), in this embodiment a resistivity of approximately $10^9$ Ωcm. This p-type or n-type semiconductor material is made from amorphous silicon containing the atoms of at least one element selected from the group consisting of carbon (C), nitrogen (N) and oxygen (O). Where the amorphous silicon contains, for example, carbon (C), the content of carbon (carbon/(carbon+silicon): c/(c+si)) is preferably from 0.1 to 50 atomic % and, in this embodiment, approximately 0.1 atomic %.

The thickness of this second barrier layer 16 is approximately 0.1 μm, or more; or, preferably, from 0.1 μm to 9 μm, and, in this embodiment, approximately 1 μm.

The photoconductive layer 18 is made of a known photoconductive material, i.e., an amorphous silicon containing the atoms of at least one of hydrogen and halogen. The thickness thereof is approximately 12 μm in this embodiment.

The surface layer 20 is made from the amorphous silicon containing carbon (C), amorphous silicon containing nitrogen (N), etc as impurities therein.

The method of manufacturing the above-mentioned electro-photographic photosensitive or photosensitive body may now be described in greater detail, with reference to FIG. 2.

As shown in FIG. 2, an apparatus for manufacturing the photosensitive body designated by reference numeral 22, has a base member 24; which member has a casing 26 openably provided thereon. Thus, a reaction vessel 28 is provided on the base member 24 so that it can be made airtight by the casing 26. Below the base member 24, a booster pump 30 and a rotary pump 32 are provided which are intended to produce a vacuum in the interior of the reaction vessel 28, and which are connected with a pipe 34 allowed to communicate with the interior of the reaction vessel 28. Within the reaction vessel 28, a drum retainer 36 is rotatably provided on the base member 24, which retainer is intended to retain the conductive base plate 12 shaped like a drum. This drum retainer 36 is connected to a drive means, for example, motor 42, intended to rotate the retainer 36 via gears 38 and 40. On the drum retainer 36, a heater 44 is provided which is used, when the conductive base plate 12 is retained, to heat this conductive base plate 12 from the inside thereof up to a temperature of, for example, 150° to 300° C. This heater 44 is connected to a power source which is not shown. Between the heater 44 and the casing 26, a gas introduction case 46 is disposed, which case is intended to introduce a gas onto the conductive base plate 12 retained by the drum retainer member 36. This gas is used to form a layer or layers on the conductive base plate 12. This gas introduction case 46 is so formed as to surround the conductive base plate 12. Within the gas introduction case 46, an electrode member 48, which is used to effect an electric discharge, is similarly so formed as to surround the conductive base plate 12. The electrode member 48 is formed with a plurality of bores through which the gas introduced into the gas introduction case 46 is ejected toward the conductive base plate 12. The electrode member 48 is connected with a power source 52 for supplying power thereto. The conductive base plate 12 is connected to a ground member 54 and, when this base plate 12 is placed on the drum retainer 36, is grounded by means of the ground member 54.

The gas introduction case 46 is connected to a pipe 58, through a valve 56, said pipe 58 being connected to a gas source 60 for supplying the gas to the gas introduction case 46. The flow rate of gas supplied to the gas introduction case 46 is adjusted by valve 56.

The method of manufacturing the photosensitive body, according to the first embodiment, which employs the above-mentioned apparatus may now be described in greater detail.

The casing 26 is opened. Then, the conductive base plate 12 shaped like a drum is mounted on the drum retainer member 36. Thereafter, the casing 26 is closed in such a manner that it is made airtight.

An electric current is allowed to pass through the heater 44, to thereby heat the conductive base plate 12 to a temperature of from 200° to 250° C.

The interior of the reaction vessel 28 is vacuumized to approximately $10^{-3}$ Torr, by the operation of the booster pump 30 and the rotary pump 32. Then, the valve 56 is opened to permit the introduction of the raw gas from the gas source. This raw gas is supplied to the gas introduction case 46 through the pipe 58 and is ejected onto the conductive base plate 12 from the bores 50. The raw gas thus ejected is discharged outside the reaction vessel by the operation of the booster pump 30. The gaseous pressure in the reaction vessel is set to 0.4 Torr by adjusting the valve 56 and the booster pump 30.

The drive means 42 is driven to cause the rotation of the conductive base plate 12 retained on the drum retainer 36.

High-frequency power of from 20 to 300 W, at 13.56 MHz is applied from the power source 52 to the electrode or electrode member, and an electric discharge is thereby caused in the raw gas. Due to this discharge, a plasma having a radical is created with the result that four layers, i.e., the first barrier layer, second barrier layer, photoconductive layer and surface layer, are formed on the conductive base plate 12.

The conditions for obtaining those layers, i.e., the composition, flow rate, and time for formation, of the raw gas are shown in Table 1 below, along with data on the thickness of the layers formed under these conditions. Here, it should be noted that the "SCCM", in terms of which the flow rate is expressed, is "standard cubic centimeter per minute ($cm^3$/min)".

TABLE 1

| LAYER | COMPOSITION | FLOW RATE (SCCM) | TIME FOR FORMATION | THICKNESS (μm) |
|---|---|---|---|---|
| FIRST BARRIER LAYER | $SiH_4$ | 150 | 1 (hr.) | 2.5 |
| | $B_2H_6/H_2$ (2000 ppm) | 72 | | |
| SECOND BARRIER LAYER | $SiH_4$ | 150 | 20 (min.) | 1 |
| | $B_2H_6/H_2$ (20 ppm) | 14.3 | | |
| | $CH_4$ | 75 | | |
| PHOTOCONDUCTIVE LAYER | $SiH_4$ | 150 | 5 (hr.) | 12 |
| | $B_2H_6/H_2$ (20 ppm) | 14.3 | | |
| SURFACE LAYER | $SiH_4$ | 150 | 2 (min.) | 0.1 |
| | $CH_4$ | 300 | | |

The capability of being charged, exhibited by the electro-photographic photosensitive body obtained according to the above-mentioned first embodiment was 470 V, as measured in surface potential, while the percentage of surface potential maintenance thereof was 76%, as measured upon the lapse of 15 seconds after it is charged.

According to this first embodiment, therefore, it is possible to provide a semiconductor device having a satisfactory percentage of surface potential maintenance, since the electro-photographic photosensitive body is high in its percentage of surface potential maintenance.

Further, since, according to the first embodiment, the first barrier layer 14 and second barrier layer 16 formed of a semiconductor are provided, the holes (carriers) produced in the photoconductive layer 18 are not hindered from moving toward the conductive base plate 12, which is one of the advantages realized by the present invention. This advantage or effect will be described below, in greater detail, in connection with FIG. 3, which shows an energy band. When light is irradiated onto a photosensitive body, paired carriers of electrons and holes are produced in the photoconductive layer. The carrier electron is attracted to the surface layer side and acts to neutralize the positive charge held on the surface layer. The carrier hole flows out of the photoconductive layer toward the conductive base plate. However, where an insulator is used for the second barrier layer, as in the case of the prior art, the carrier hole is hindered from flowing out, due to the resultant high energy level, such as that shown in FIG. 3 by a broken line, which constitutes a wall. Consequently, the residual potential of the photosensitive body increases in level. Thus, it is impossible to obtain a clear image.

According to this first embodiment, however, since a semiconductor is used as the material of which the second barrier layer is formed, the second barrier layer does not hinder the carrier hole from flowing out toward the photoconductive base plate. Thus, the residual potential approaches zero, and it becomes possible to obtain a clear image.

The reasons for specifying the respective preferred values of thickness and resistivity with respect to each of the first and second barrier layers 14, 16 will be described below, in accordance with the experimental results.

The "thickness" based on an evaluation of the images obtained when the thickness of the first and second barrier layers 14, 16 is widely varied, is as shown in Table 2 below.

TABLE 2

| THICKNESS OF FIRST BARRIER LAYER (μm) | THICKNESS OF SECOND BARRIER LAYER (μm) 0.05 | 0.1 | 1.0 | 4.0 |
|---|---|---|---|---|
| 0.1 | BAD | UNDESIRABLE | UNDESIRABLE | UNDESIRABLE |
| 0.5 | UNDESIRABLE | GOOD | EXCELLENT | EXCELLENT |
| 1.0 | UNDESIRABLE | EXCELLENT | EXCELLENT | EXCELLENT |
| 2.0 | UNDESIRABLE | EXCELLENT | EXCELLENT | EXCELLENT |

As shown in Table 2, where the thickness of the first barrier layer 14 is 0.1 μm or less, white spots or white lines appear in a halftone of the resultant image and; therefore, a bad image is formed. The reason for this is considered to lie in the respect that the irregularities of the surface of the conductive base plate failed to be convered because of the first barrier layer 14 being thin.

Where the thickness of the second barrier layer 16 is 0.05 μm or less, a developer is attached to the light receiving portion, since the voltage against the developing bias is low (Generally, at the time of developing, a voltage of 200 to 300 V is applied to the photosensitive body, to make the potential of the developer higher than that of the light receiving portion of the photosensitive body, thus preventing the developer from being attached to the photosensitive body). Furthermore, a bias leak occurred, as well.

Figure 4:
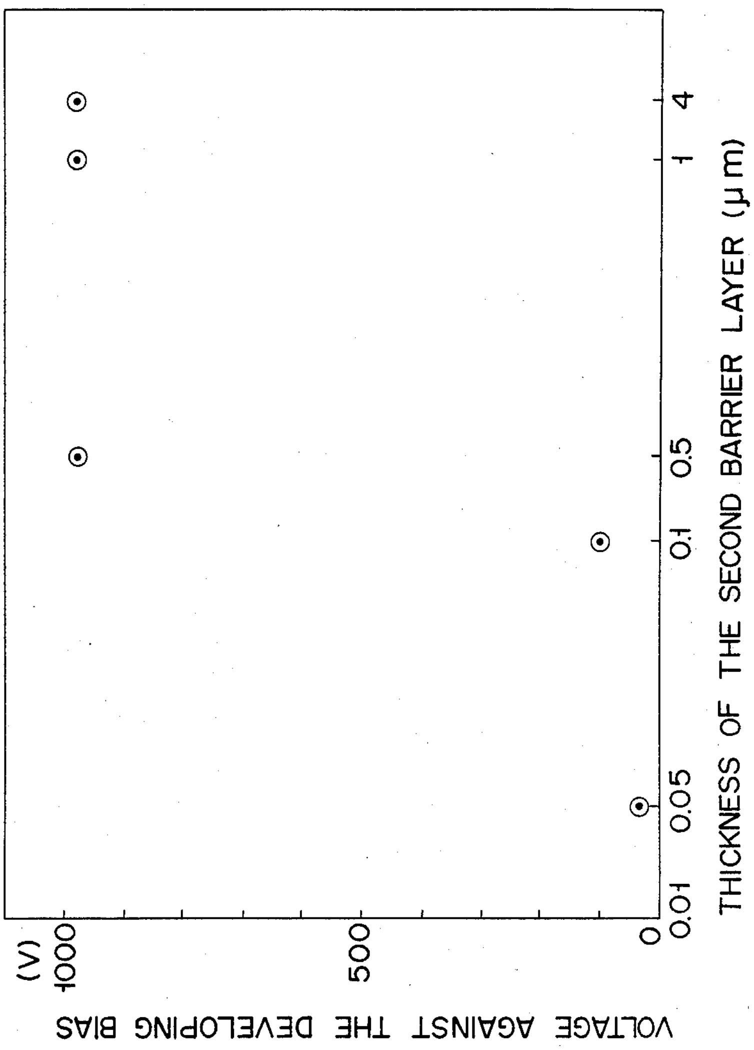
FIG. 4 is a linear diagram showing the relationship between the thickness of a second barrier layer and the voltage against the developing bias where the thickness of the first barrier layer is 1.0 μm.

In FIG. 4, the voltage against the developing bias is shown in relation to the thickness of the first and second barrier layers 14, 16 of the photosensitive body, said first barrier layer 14 having a thickness set at a value of 1 μm and said second barrier layer 16 having a thickness ranging from 0.05 μm to 4 μm. As shown in FIG. 4, when the thickness of the second barrier layer 16 is 0.1 μm or more, the voltage against the developing bias is increased.

The photosensitive body, which has an evaluation of "EXCELLENT" in Table 2, was subjected to a usage test, which was repeated one million times. As a result, however, the performance of the photoconductor did not deteriorate.

Figure 5:
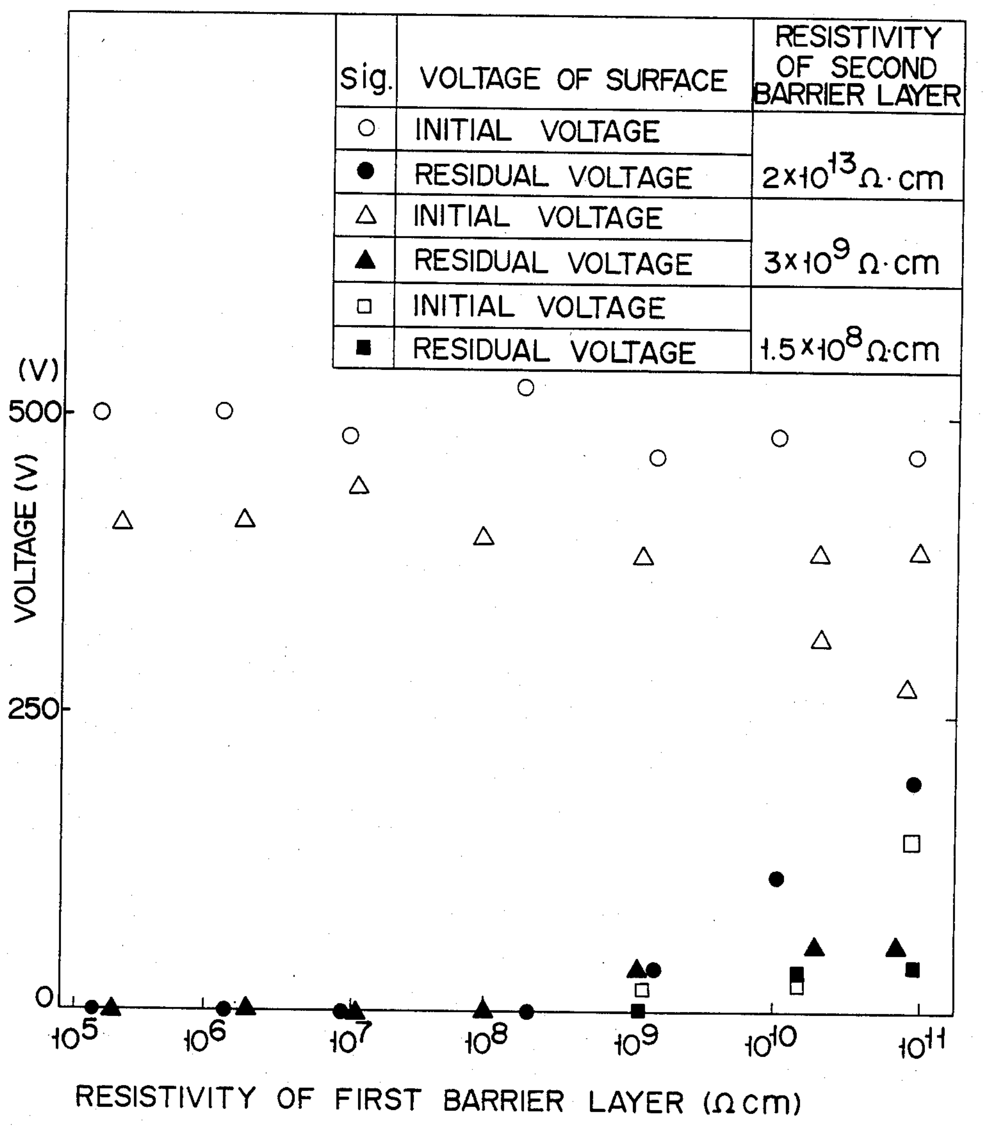
FIG. 5 is a linear diagram showing the relationship between the resistivity of the first and second barrier layer and the initial voltage applied.

The "resistivity", which is the relationship between the initial voltage (surface potential, as measured 0.1 seconds after the photosensitive body is charged) and the residual voltage (surface potential after light exposure is made onto the charged surface at the rate of 10 lux·sec), both being attained where the resistivity of each of the first and second barrier layers is widely varied, are shown in FIG. 5. In FIG. 5, the thickness of the first barrier layer 14 is 0.5 μm and the thickness of the second barrier layer 16, 1 μm. As may readily be seen from FIG. 5, when the resistivity of the first barrier layer is $10^9$ Ωcm or less and that of the second barrier layer is more than $10^9$ Ωcm, the residual voltage is barely existent; and, yet, the surface potential can be maintained at a level of around 400 V or more. This is an excellent characteristic for the photosensitive body.

It should be noted here that the respective resistivities of the first and second barrier layers can be selectively determined by, e.g., selecting the kind or quantity of an impurity doped onto these layers.

In Table 3 (below), the conditions for manufacturing the photosensitive body according to a second embodiment of the present invention are shown. The photoconductor according to the second embodiment differs from that obtained according to the first embodiment; in that, while the second barrier layer 16 and surface layer 20 of the photosensitive body according to the latter embodiment each contain carbon (C), those of the photoconductor according to the former embodiment each contain nitrogen (N). Namely, according to the former embodiment, manufacture of the photosensitive body is made by using anmonia gas ($NH_3$) in place of the methane gas ($CH_4$) shown in Table 1. The photosensitive body obtained according to the former embodiment offers advantages similar to those attained with the photosensitive body according to the latter embodiment.

TABLE 3

| LAYER | COMPOSITION | FLOW RATE (SCCM) | TIME OF FORMATION | THICKNESS (μm) |
|---|---|---|---|---|
| FIRST BARRIER LAYER | $SiH_4$ | 150 | 1 (hr.) | 2.5 |
| | $B_2H_6/H_2$ (2000 ppm) | 72 | | |
| SECOND BARRIER LAYER | $SiH_4$ | 150 | 20 (min.) | 1 |
| | $B_2H_6/H_2$ (20 ppm) | 14.3 | | |
| | $NH_3$ | 75 | | |
| PHOTOCONDUCTIVE LAYER | $SiH_4$ | 150 | 5 (hr.) | 12 |
| | $B_2H_6/H_2$ (20 ppm) | 14.3 | | |
| SURFACE LAYER | $SiH_4$ | 150 | 2 (min.) | 0.1 |
| | $NH_3$ | 300 | | |

A third embodiment of the present invention may be described as follows, with reference to FIGS. 6 and 7.

Figure 6:
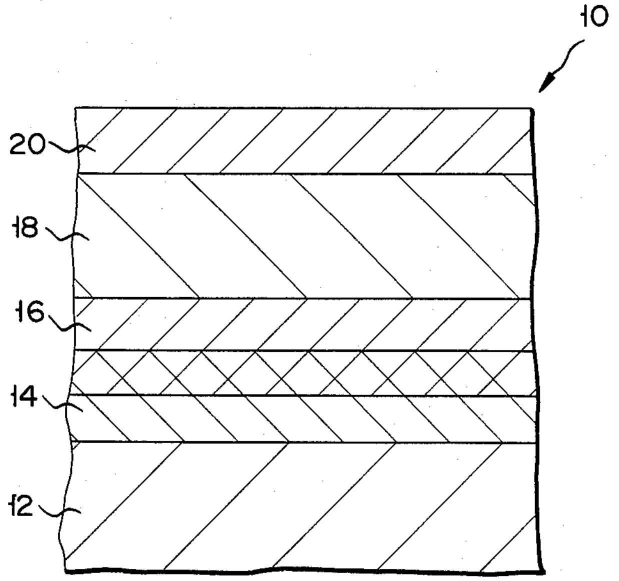
FIG. 6 is a sectional view showing the semiconductor device according to a second embodiment of the present invention.

In this third embodiment, the first and second barrier layers are formed in such a manner that both layers are continuous, with no boundary face provided therebetween, as shown in FIG. 6; and, therefore, the third embodiment differs from the preceding embodiments, wherein both layers are completely divided into two separate layers by a boundary face. Thus, the concentration of the dopant into the first and second barrier layers made of an amorphous semiconductor is serially changed on a continuous basis.

The photosensitive body according to the third embodiment is obtained by continuously and serially changing, over time, the concentration of the raw gas to be injected, as shown, for example, in Table 4.

TABLE 4

UNIT: SCCM
T: Time (min.)

| GAS | TIME (min.) 0~5 | 5~10 | 10~15 | 15~20 | 20~140 | 140~150 |
|---|---|---|---|---|---|---|
| $SiH_4$ | 400 (SCCM) | 400 | 400 | 400 | 400 | 400 |
| $B_2H_6$ (2000 ppm) | 100 | $100\exp(-0.4(T-5)^2)$ | 0 | 0 | 0 | 0 |
| $B_2H_6$ (20 ppm) | 25 | 25 | 25 | 25 | 25 | $25\exp(-0.1(T-140)^2)$ |
| $CH_4$ | 50 | 50 | 50 | $50\exp(-0.1(T-15)^2)$ | 0 | $400\exp(-0.12(150-T)^2)$ |

Figure 7:
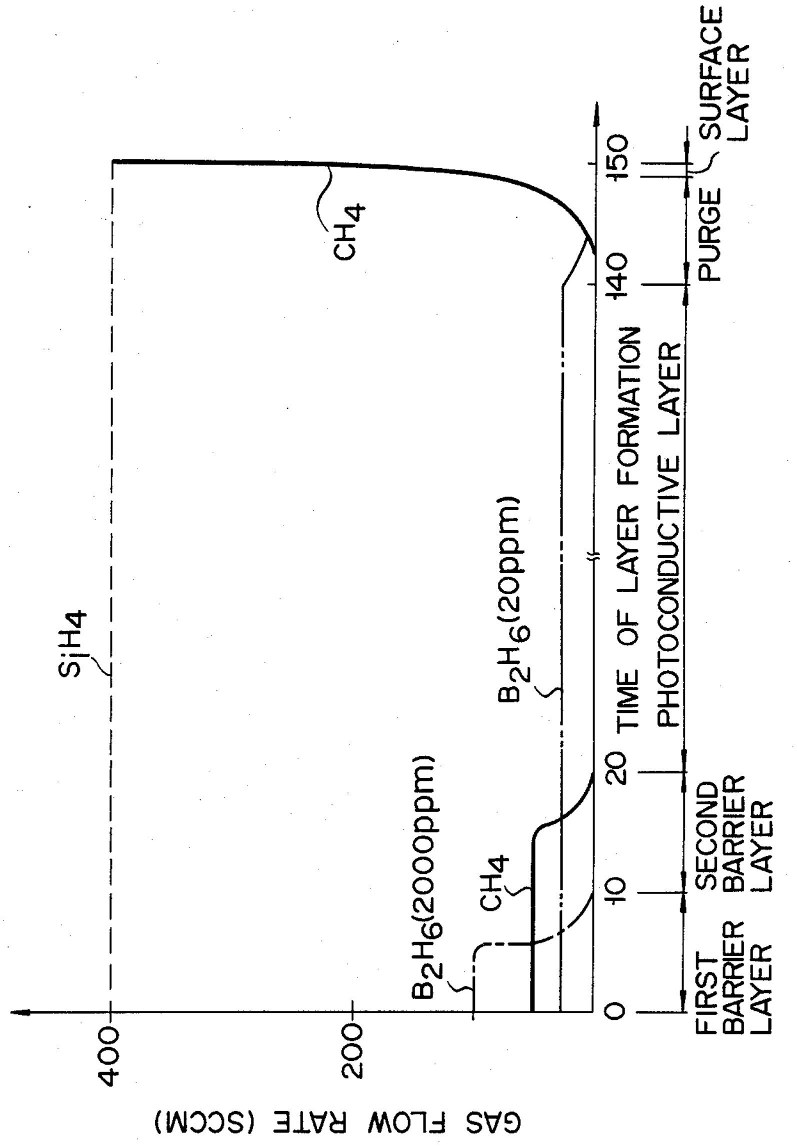
FIG. 7 is a linear diagram for use in explaining an example of a method for manufacturing the semiconductor device shown in FIG. 6.

The relationship between the gas concentration shown in Table 4 (above), the flow rate of gas, and the time for layer formation is shown in FIG. 7. Note here that the concentration of $B_2H_6$ shown in Table 4 and FIG. 7 is the concentration of $B_2H_6$ as diluted by hydrogen, i.e., the value of $B_2H_6/(B_2H_6+H_2)$.

The method of manufacturing the photosensitive body according to this third embodiment may now be described with reference to Table 4, FIG. 2 and FIG. 7.

Initially, an $SiH_4$ gas is introduced, as one component of the raw gas, into the reaction vessel 26 shown in FIG. 2. Simultaneously, a $B_2H_6$ gas and a $CH_4$ gas are introduced, with from 0.01% to 1% by volume being based on the amount of $SiH_4$ gas being introduced, and 10% to 100% by volume being based on the amount thereof, respectively.

The inside pressure of the reaction vessel 26 is adjusted to 0.4 Torr and high-frequency power of 200 W is applied to the gas introduction case 46. This state is maintained as it is for 5 minutes, thereby effecting layer formation.

Subsequently, layer formation is effected for 5 minutes while the amount of $B_2H_6$ is being reduced, in the form of an exponential function, or a function of $100\times\exp(-0.4(T-5)^2)$ in this embodiment, so that the volume ratio thereof to the $SiH_4$ gas being introduced may become from $1\times10^{-6}$ to $1\times10^{-7}$. In this case, T represents Time (minute). After the layer formation is thus made for 10 minutes in total, the first barrier layer 14 is obtained. During this period of time, a methane ($CH_4$) gas is introduced, at a flow rate of 50 SCCM, into the reaction vessel.

Subsequently, the amount of the $CH_4$ gas being introduced is reduced, in the form of an exponential function, or a function of $50\times\exp(-0.1(T-15)^2)$ in this embodiment, for the last 5 minutes of a subsequent 10 minutes, i.e., for a time period of from the 10th to the 20th minute inclusive, as reckoned from the time of the initial gas introduction. After the lapse of this 10 minutes, the second barrier layer is formed.

Subsequently, the photoconductive layer is formed in two hours, i.e., within the period of time from the 20th to the 140th minute, as counted from the time of the initial gas introduction. During this period of time, the $SiH_4$ gas and the $B_2H_6$ of 20 ppm gas are introduced as the raw gaseous material.

Thereafter, the application of power from the power source 52 to the gas introduction case 46 is stopped. During a subsequent 10 minutes, i.e., during the period of time from the 140th to the 150th minute, as counted from the initial starting time of gas introduction, the $B_2H_6$ gas and the $CH_4$ gas are introduced into the reaction vessel 26, in accordance with a function expressed as $25\times\exp(-0.1(T-140)^2)$ and a function expressed as $400\times\exp(-0.12(150-T)^2)$, respectively, so that the volume ratio of the former gas may become 0 and the amount of the latter gas being introduced may from 100% to 500% by volume. In this case, it is to be noted that, during the last 1 minute, i.e., the 150th minute, as calculated from the time of initial gas introduction, a power of 200 W is applied to the gas introduction case 46. During this period of time, i.e., from the 140th to the 150th minute, the surface layer is formed.

The photosensitive body according to this third embodiment has advantages similar to those attained by the photosensitive body according to the first and second embodiments.

Furthermore, the photosensitive body according to the third embodiment is so formed that the concentration of the impurity is continuously and serially changed at the boundary face between the first and second barrier layers. Therefore, it is impossible for both layers or films to be exfoliated from each other due to a difference in the surface irregularities therebetween.

TABLE 5

UNIT: SCCM

| GAS | TIME (min.) 0~5 | 15~20 | 20~140 | 140~150 |
|---|---|---|---|---|
| $SiH_4$ | 400 | 400 | 400 | 400 |
| $B_2H_6$ (2000 ppm) | 100 | 100 exp $(-0.4(T-15)^2)$ | 0 | 0 |
| $B_2H_6$ (20 ppm) | 25 | 25 | 25 | 25 exp $(-0.1(T-140)^2)$ |
| $CH_4$ | 50 | 50 exp $(-0.4(T-15)^2)$ | 0 | 400 exp $(-0.12(150-T)^2)$ |

Figure 8:
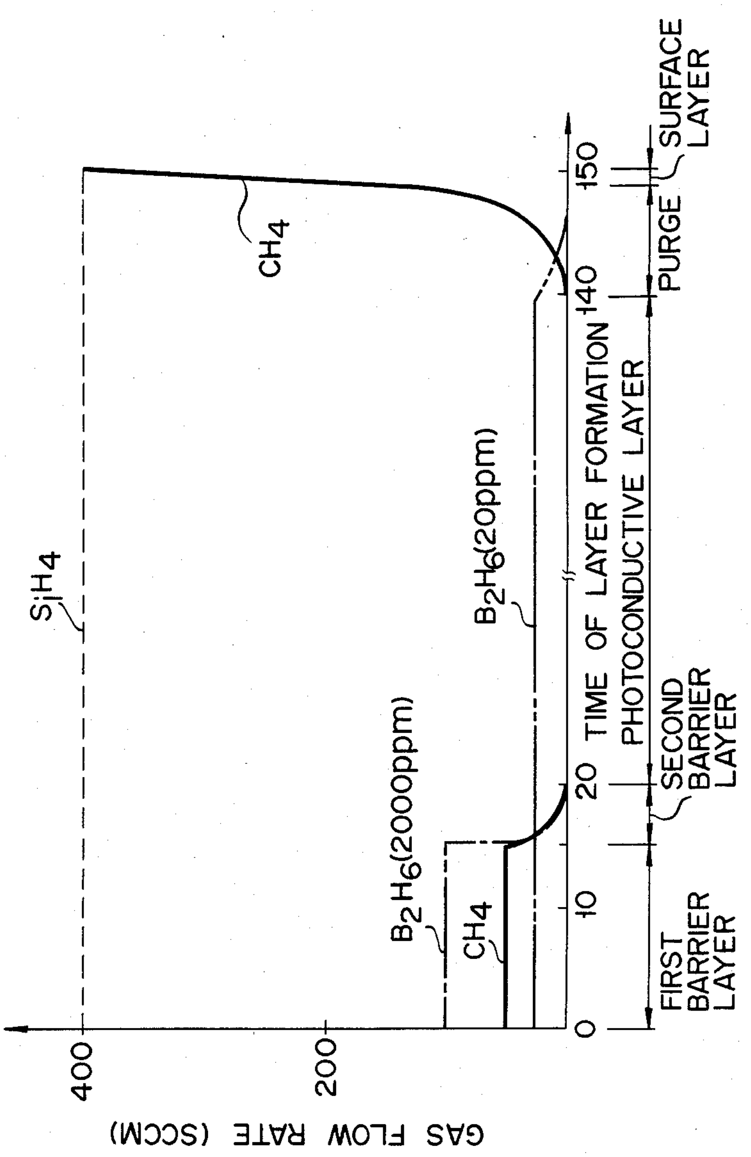
FIG. 8 is a linear diagram for use in explaining another example of the method for manufacturing the semiconductor device shown in FIG. 6.

A fourth embodiment of the present invention may be described, with reference to FIG. 8 and Table 5 (above). Since this fourth embodiment only differs from the third embodiment with respect the concentration of carbon (C) within the second barrier layer, description will be only made of the method of manufacturing the second barrier layer, a description of the method of manufacturing the other portions being omitted here.

The method of manufacturing the second barrier layer according to this fourth embodiment is to reduce the concentrations of boron ($B_2H_6$) and methane ($CH_4$), in accordance with the exponential functions of $100\times\exp(-0.4(T-15)^2)$ and $50\times\exp(-0.4(T-15)^2)$, respectively, after the lapse of the time required in forming the first barrier layer. In these functions, T represents the time elapsed. In the photosensitive body obtained according to this manufacturing method, the amounts of boron (B) and carbon (C) contained in the second barrier layer are each reduced continuously toward the photoconductive layer.

This fourth embodiment also makes it possible to obtain advantages similar to those attained with the above-mentioned third embodiment.

The present invention is not limited to the above-mentioned embodiments, since various modifications may be made without departing from its spirit and scope.

In the first, second and third embodiments, the barrier layer can be formed as a p-type or an n-type semiconductor layer, in accordance with its use/purpose, i.e., according to whether the electric charge is positively or negatively charged on the surface of the photosensitive body, by selectively using an element of Group IIIA or VA of the periodic table as an impurity doped into the layer. Thus, in the first, second and third embodiments, boron (B) was used as the element of Group IIIA, though the same advantages or effects can also be attained when an element of Group VA, e.g., phosphorus (P), is used.

In all of the above-mentioned embodiments, the resistivity of the semiconductor can be also controlled by adding the atoms of any one of nitrogen, carbon or oxygen, as an impurity.

Further, in the manufacturing method according to any one of the above-mentioned embodiments, the $CH_4$ gas was used for the adding of carbon (C). However, the present invention is not limited thereto. A $C_2H_4$, $C_2H_6$, $C_2H_2$ or $C_2H_4$ gas can be also used.

Still further, the $NH_3$ gas was used for the adding of nitrogen (N), though the present invention is not limited thereto. An $NH_3$, $N_2$, or $NH_2$—$NH_2$ gas can be also used.

Finally, where oxygen is used as an impurity in place of carbon or nitrogen, an $O_2$, $N_2O$, NU, $NU_2$, $N_2O_4$, $CO_2$, CO, or $O_2$ gas can also be used.

What is claimed is:

1. A light sensitive semiconductor device, comprising:

a photoconductive layer means for generating carriers which carry an electric charge when said photoconductive layer is irradiated with light;

a conductive base member supporting said photoconductive layer;

first barrier layer means, provided between said photoconductive layer and said conductive base member, for hindering the movement of an electric charge from said conductive base member to said photoconductive layer, and for permitting the movement of an electric charge from said photoconductive layer to said conductive base member, said first barrier layer means comprising an extrinsic semiconductor; and a second barrier layer means, provided between said photoconductive layer and said first barrier layer means for hindering the movement of an electric charge from said conductive base member to said photoconductive layer, and for permitting the movement of an electric charge from said photoconductive layer to said conductive base member, said second barrier layer comprising an extrinsic semiconductor;

said hindering and permitting by said first and second barrier layer means thereby causing the residual potential of said photoconductive layer to be minimized.

2. A semiconductor device according to claim 1, wherein said first barrier layer means has a predetermined resistivity; and said second barrier layer means has a resistivity different from that of said first barrier layer means.

3. A semiconductor device according to claim 2, wherein said photoconductive layer has a surface layer on its surface portion, and the electric charge to be charged therein is held on said surface layer.

4. A semiconductor device according to claim 1, wherein said photoconductive layer has a surface layer on its surface portion, and the electric charge to be charged therein is held on said surface layer.

5. A semiconductor device according to claim 1, wherein said first barrier layer means is formed with an impurity added thereto, to thereby control the electrons in said first barrier layer means.

6. A semiconductor device according to claim 5, wherein the impurity used to control the electrons of said first barrier layer means is at least one element selected from the group consisting of Groups IIIA and VA of the periodic table.

7. A semiconductor device according to claim 6, wherein the impurity used to control the electrons of said first barrier layer means includes at least one element selected from the group consisting of carbon (C), nitrogen (N) and oxygen (O).

8. A semiconductor device according to claim 7, wherein said first barrier layer means includes amorphous silicon as a main component.

9. A semiconductor device according to claim 1, wherein said second barrier layer means includes amorphous silicon as a main component.

10. A semiconductor device according to claim 9, wherein said second barrier layer means includes the atoms of at least one element selected from the group consisting of carbon (C), nitrogen (N) and oxygen (O).

11. A semiconductor device according to claim 10, wherein said second barrier layer means includes the atoms of at least one element selected from group elements consisting of Group IIIA and VA of the periodic table.

12. A semiconductor device according to claim 10, wherein said surface layer includes the atoms of at least one element selected from the group consisting of carbon (C), nitrogen (N) and oxygen (O).

13. A semiconductor device according to claim 1, wherein at least one of said first barrier, second barrier, and photoconductive layer is comprised of amorphous silicon; said amorphous silicon including as an impurity for controlling its valence electrons, the atoms of at least one element selected from the group consisting of the elements in Group IIIA and VA of the periodic table.

14. A semiconductor device according to claim 1, wherein said first barrier layer means and said second barrier layer means are each comprised of the same material as its main component.

15. A semiconductor device according to claim 14, wherein said first barrier layer means and said second barrier layer means include the same kind of impurity for controlling their respective valence electrons, the concentration of said impurity used in said first barrier layer means being different from that in said second barrier layer means.

16. A semiconductor device according to claim 15, wherein said first and second barrier layers means each include the atoms of at least one element selected from the group consisting of carbon (C), nitrogen (N) and oxygen (O).

17. A semiconductor device according to claim 1, wherein said first barrier layer means has a predetermined resistivity; and said second barrier layer has a resistivity higher than that a said first barrier layer.

* * * * *